United States Patent
Tokie et al.

(10) Patent No.: US 9,301,397 B2
(45) Date of Patent: Mar. 29, 2016

(54) METHODS OF CONTINUOUSLY WET ETCHING A PATTERNED SUBSTRATE

(71) Applicant: 3M INNOVATIVE PROPERTIES COMPANY, St. Paul, MN (US)

(72) Inventors: Jeffrey H. Tokie, Scandia, MN (US); Joseph W. Woody, V, St. Paul, MN (US); Thomas M. Lynch, Woodbury, MN (US); Daniel M. Lentz, Woodbury, MN (US); Robert S. Davidson, Bloomington, MN (US); Cristin E. Moran, St. Paul, MN (US); Lijun Zu, Woodbury, MN (US)

(73) Assignee: 3M INNOVATIVE PROPERTIES COMPANY, Saint Paul, MN (US)

( * ) Notice: Subject to any disclaimer, the term of this patent is extended or adjusted under 35 U.S.C. 154(b) by 159 days.

(21) Appl. No.: 14/238,781

(22) PCT Filed: Sep. 19, 2012

(86) PCT No.: PCT/US2012/055997
§ 371 (c)(1),
(2) Date: Feb. 13, 2014

(87) PCT Pub. No.: WO2013/048834
PCT Pub. Date: Apr. 4, 2013

(65) Prior Publication Data
US 2014/0231381 A1    Aug. 21, 2014

Related U.S. Application Data

(60) Provisional application No. 61/541,553, filed on Sep. 30, 2011.

(51) Int. Cl.
*H05K 3/06* (2006.01)
*C23F 1/00* (2006.01)
(Continued)

(52) U.S. Cl.
CPC .. *H05K 3/06* (2013.01); *C02F 1/10* (2013.01); *C23F 1/00* (2013.01); *C23F 1/02* (2013.01); *C23F 1/08* (2013.01); *C23F 1/30* (2013.01); *C23F 1/46* (2013.01); *H05K 3/068* (2013.01); *H05K 2203/1545* (2013.01)

(58) Field of Classification Search
None
See application file for complete search history.

(56) References Cited

U.S. PATENT DOCUMENTS

| 3,287,191 | A | 11/1966 | Borth |
| 3,340,195 | A | 9/1967 | Borth |

(Continued)

FOREIGN PATENT DOCUMENTS

| DE | 4015141 | 11/1991 |
| EP | 1 780 309 | 2/2007 |

(Continued)

OTHER PUBLICATIONS

PCT International Search Report for PCT/US2012/055997 mailed on Jan. 18, 2013, 4 pages.

*Primary Examiner* — Jiong-Ping Lu
(74) *Attorney, Agent, or Firm* — Yufeng Dong; Douglas B. Little

(57) ABSTRACT

Metalized web substrate is wet etched in a reaction vessel by contacting with oxidizing and metal complexing agent to remove metal from unpatterned region. Following etching, substrate is rinsed, and rinse is at least partly recycled. Concentrations of oxidizing and metal complexing agents in the etchant bath are maintained by delivering replenishment feeds of each. Concentration of metal in the etchant bath is maintained by discharging some of the etchant bath. Replenishment rates of oxidizing and metal complexing agents and etchant removal rate are determined based at least in part on rate that metal etched from the substrate enters the etchant bath.

20 Claims, 1 Drawing Sheet

(51) Int. Cl.
*C02F 1/10* (2006.01)
*C23F 1/02* (2006.01)
*C23F 1/08* (2006.01)
*C23F 1/30* (2006.01)
*C23F 1/46* (2006.01)

(56) References Cited

U.S. PATENT DOCUMENTS

| | | |
|---|---|---|
| 3,475,242 A | 10/1969 | Radimer |
| 3,844,857 A | 10/1974 | Chiang |
| 3,905,827 A * | 9/1975 | Goffredo et al. ............... 75/726 |
| 4,051,026 A | 9/1977 | Cremers et al. |
| 5,221,421 A | 6/1993 | Leibovitz et al. |
| 5,672,407 A | 9/1997 | Beckett |
| 6,083,374 A | 7/2000 | Kopp |
| 6,150,279 A | 11/2000 | Ku |
| 6,841,084 B2 | 1/2005 | Lillie et al. |
| 2012/0082825 A1 | 4/2012 | Zu et al. |

FOREIGN PATENT DOCUMENTS

| | | |
|---|---|---|
| GB | 1 400 510 | 7/1975 |
| WO | WO 2006/061741 | 6/2006 |
| WO | WO 2010/151471 | 12/2010 |

* cited by examiner

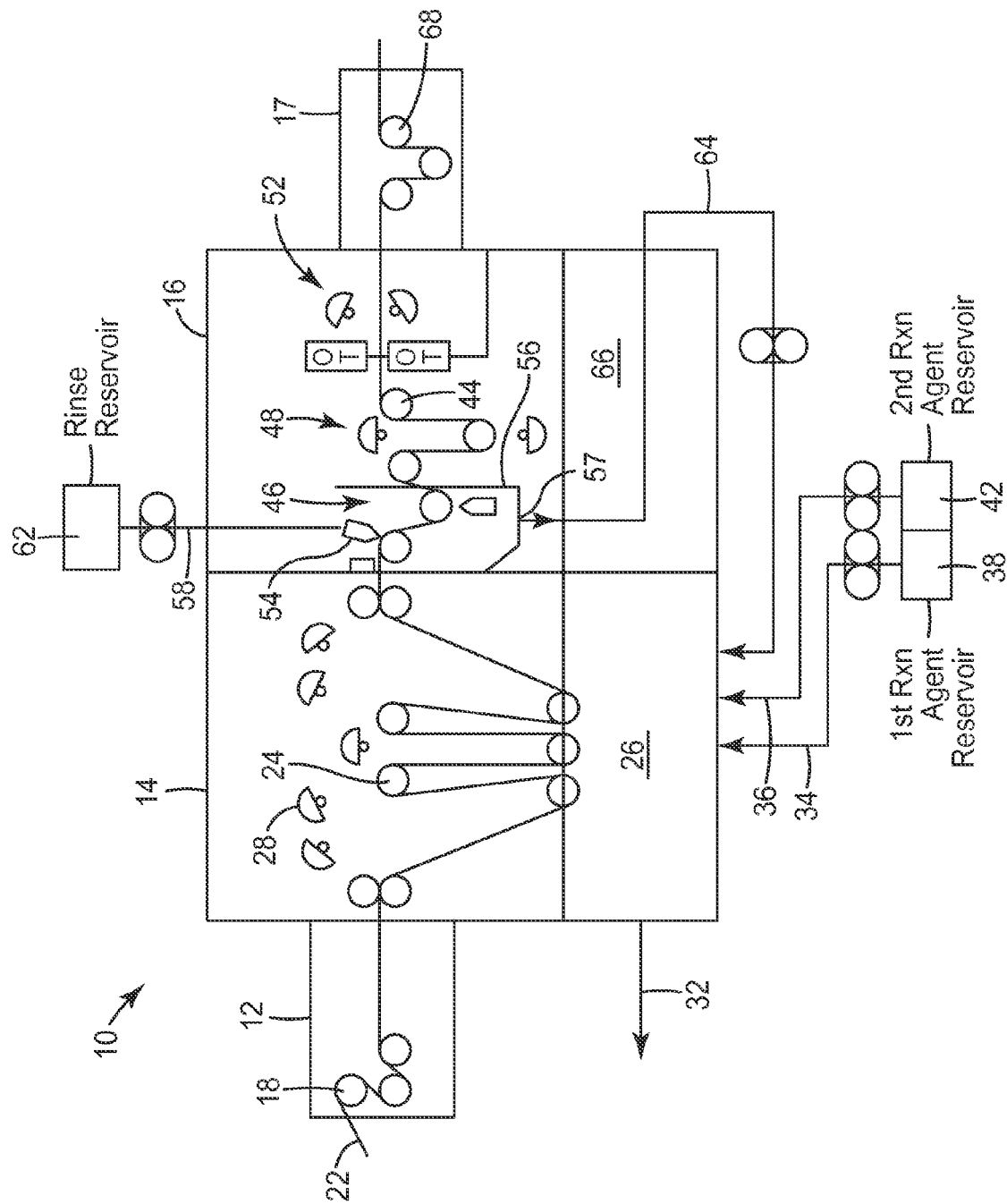

_US 9,301,397 B2_

METHODS OF CONTINUOUSLY WET ETCHING A PATTERNED SUBSTRATE

CROSS REFERENCE TO RELATED APPLICATIONS

This application is a national stage filing under 35 U.S.C. 371 of PCT/US2012/055997, filed Sep. 19, 2012, which claims priority to U.S. Provisional Application No. 61/541,553 filed Sep. 30, 2011, the disclosure of which is incorporated by reference in its entirety herein.

FIELD

The present disclosure relates to methods for continuously processing substrates having reactable surface compositions and, more particularly, to continuously wet etching metalized, patterned substrates.

SUMMARY

In a first aspect, a method for patterning a substrate is provided. The method may include providing a substrate comprising a metalized surface having an etch resist patterned region and an unpatterned region and passing the substrate through a reaction vessel. The reaction vessel may include an etchant bath including an oxidizing agent and a metal complexing agent. The method may further include wet etching the substrate within the reaction vessel by contacting the metalized surface with the oxidizing and metal complexing agents to remove metal from the unpatterned region, maintaining the concentrations of the oxidizing and metal complexing agents in the etchant bath by delivering a replenishment feed of each of the oxidizing and metal complexing agents to the etchant bath at a first replenishment feed rate and a second replenishment feed rate, respectively, and maintaining the concentration of the metal in the etchant bath by discharging an amount of the etchant bath from the reaction vessel at an etchant bath removal rate. The first and second replenishment feed rates and the etchant bath removal rate may be determined based at least in part on a rate that metal etched from the substrate enters the etchant bath.

In a second aspect, a method for processing a substrate is provided. The method may include providing a substrate and passing the substrate through a reaction vessel. The substrate may include a reactable surface composition and the reaction bath may include a first reaction agent and a second reaction agent. The method may further include contacting the reactable surface composition with the first and second reaction agents to carry out a reaction therebetween and maintaining the concentrations of the first and second reaction agents in the reaction bath by delivering a replenishment feed of each of the first and section reaction agents to the reaction bath. The first and second reaction agents may be delivered to the reaction bath at a first replenishment feed rate and a second replenishment feed rate, respectively. The first and second replenishment feed rates may be determined based at least in part on a rate that the substrate is transported through the reaction vessel.

The above summary of the present disclosure is not intended to describe each embodiment of the present invention. The details of one or more embodiments of the invention are also set forth in the description below. Other features, objects, and advantages of the invention will be apparent from the description and from the claims.

BRIEF DESCRIPTION OF THE DRAWINGS

The disclosure may be more completely understood in consideration of the following detailed description of various embodiments of the disclosure in connection with the accompanying figures, in which:

FIG. 1 illustrates a schematic diagram of a system for continuously processing a substrate having a reactable surface composition in accordance with some embodiments of the present disclosure.

DETAILED DESCRIPTION

Microcontact printing uses micropatterned elastomeric stamps, typically made from polydimethyl siloxane (PDMS), that are inked and placed onto a substrate to localize a chemical reaction between molecules of the ink that are able to form a self-assembled monolayer (SAM) on the substrate. The patterned SAMs resulting from such technique have served as resists for selectively etching metal and metalized substrates, to form electrically conductive patterns.

Processes for selectively etching metal patterned substrates include contacting the substrate with fluid from an etchant bath to remove the metal from the unpatterned regions. For example, International Publication WO 2010/151471 describes a method for wet etching a SAM patterned metalized substrate that includes passing the substrate through an etchant bath that is agitated with a bubbling gas. In such methods, as the primary etching reaction and any side reactions occur, the etchant species present in the etchant bath are consumed which, in turn, lowers their concentration, thereby slowing the etchant rate. Additionally, metal removed by the etching process is deposited into the etchant bath which, over time, causes the concentration of the metal in the etchant bath to build, thereby resulting in the formation of defects (e.g., precipitate films, residues) on the etched substrate. Consequently, as the concentrations of the etchant species and/or the metal in the etchant bath fall below or exceed predetermined thresholds, the etching process must be interrupted periodically to allow for replacement of the etchant bath. Therefore, methods for controlling and/or maintaining the concentrations of the etchant species and/or etched metal in the etchant bath, and thereby allowing for extended runs of continuous wet etching of a patterned, metalized substrate may be desirable. Heretofore, such methods have proven difficult at least because there exists no feasible means to track, in real time, the relative concentrations of etchant species or metal in the etchant bath.

In some embodiments, the present disclosure relates to methods for controlling and/or maintaining concentration of etchant species and/or metal in an etchant bath utilized for continuously wet etching a patterned, metalized substrate, by controlling the rates of one or more etchant species replenishment feeds to and/or a discharge flow from the etchant bath. In lieu of determination based on real-time measurements of the concentration of the etchant species and metal in the etchant bath, the methods of the present disclosure may include determining the aforementioned rates based on reaction kinetics and the rate that metal etched from the substrate enters the etchant bath.

As used in this patent application, including the claims, "etchant" means a material (e.g., liquid) for removing the metal from unpatterned regions of a metalized substrate by chemical reaction, dissolution, or a combination thereof (for example, by contacting the substrate with an etchant solution that dissolves the metal or reacts with the metal to yield soluble products);

As used in this specification and the appended embodiments, the singular forms "a", "an", and "the" include plural referents unless the content clearly dictates otherwise. Thus, for example, reference to a composition containing "a compound" includes a mixture of two or more compounds. As used in this specification and the appended embodiments, the term "or" is generally employed in its sense including "and/or" unless the content clearly dictates otherwise.

As used in this specification, the recitation of numerical ranges by endpoints includes all numbers subsumed within that range (e.g. 1 to 5 includes 1, 1.5, 2, 2.75, 3, 3.8, 4, and 5).

Unless otherwise indicated, all numbers expressing quantities or ingredients, measurement of properties and so forth used in the specification and embodiments are to be understood as being modified in all instances by the term "about." Accordingly, unless indicated to the contrary, the numerical parameters set forth in the foregoing specification and attached listing of embodiments can vary depending upon the desired properties sought to be obtained by those skilled in the art utilizing the teachings of the present disclosure. At the very least, and not as an attempt to limit the application of the doctrine of equivalents to the scope of the claimed embodiments, each numerical parameter should at least be construed in light of the number of reported significant digits and by applying ordinary rounding techniques.

FIG. 1 illustrates a schematic diagram of a system 10 for continuously processing substrate having a reactable surface composition in accordance with some embodiments of the present disclosure. The system 10 may include an entry zone 12, a reactor vessel 14, a rinse chamber 16, and a drying zone 17.

In various embodiments, the entry zone 12 may include a plurality of rollers 18 configured and arranged to direct a substrate 22 into the reactor vessel 14 at a selected rate (e.g., web speed) and orientation. As will be described in further detail below, the substrate 22 may be formed as a continuous web that includes a reactable surface composition that is capable of reacting and/or solubilizing upon contact with one or more reaction agents of a reaction bath within the reactor vessel 14. In some embodiments, the substrate may be formed as a continuous web that includes a film and a reactable surface composition that includes a metallic coating disposed on a major surface of the film.

In illustrative embodiments, the reactor vessel 14 may include a plurality of rollers 24 configured and arranged to direct the substrate 22 through the reactor vessel 14 such that fluid from a reaction bath 26 contacts a major surface of the substrate 22. For example, the rollers 24 may be configured and arranged to direct the substrate 22 into the etchant bath 26 (i.e., at least partially immerse the substrate 22 in the etchant bath). In such embodiments, the reactor vessel 14 may further include one or more agitation devices (e.g., bubblers, stirrers, ultrasonic horns, sprayers, sparging jets, fluid bearings, fluid knives, educators, and the like) positioned within the reaction bath 26 and configured to facilitate agitation of the reaction bath 26 proximate a major surface of the substrate 22. Additionally, or alternatively, as shown in FIG. 1, a plurality of fluid delivery devices 28 (e.g., sprayers) may be positioned proximate the path of the substrate 22. The sprayers 28 may be in fluid communication with the reaction bath 26 and may be operatively associated with a pumping mechanism, such that the fluid of the reaction bath 26 may be discharged onto a major surface of the substrate 22 via the fluid delivery devices 28.

In various embodiments, the system 10 may be configured to control and/or maintain one or more characteristics (e.g., reaction agent concentrations, metal concentration, volume, etc.) of the reaction bath 26. In this regard, the reactor vessel 14 may include one or more input flow paths and one or more output flow paths, which are in fluid communication with the reaction bath 26. For example, the reactor vessel 14 may include a reaction bath discharge flow path 32. The discharge flow path 32 may include and/or be operatively associated with suitable fluid flow control components (e.g., valves, pumps, meters) such that reaction bath 26 may be removed from the reaction vessel 14 at a selected rate. Additionally, the reactor vessel may include a first reaction agent replenishment input flow path 34 and a second reaction agent replenishment input flow path 36. The input flow paths 34 and 36 may be in fluid communication with a first reaction agent reservoir 38 and a second reaction agent reservoir 42, respectively, which contain an amount of the first and second reaction agent at known concentrations. The input flow paths 34 and 36 may also include and/or be operatively associated with suitable fluid flow control components (e.g., valves, pumps, meters) such that a replenishment feed of the first reaction agent and a replenishment feed of the second reaction agent may be selectively and independently delivered to the reaction bath 26. While the present disclosure is described with respect to embodiments in which the reaction bath 26 consists of two replenishment inputs (and thus two reaction agents), it is to be appreciated that baths consisting of one or three or more replenishment inputs are within the scope of the present disclosure.

During transport of the substrate 22 through the reactor vessel 14, an amount of reaction bath 26 may collect on the substrate 22 and be transported to the rinse chamber 16. This collection, referred to herein as "dragout," in addition to contributing to loss of reaction agents from the bath 26, may contaminate rinse solutions collected in the rinse chamber 16. Therefore, in some embodiments, it may be desirable to minimize the amount of dragout transported, via the substrate 22, to the rinse chamber 16. In this regard, the reactor vessel 14 may further include one or more devices configured to facilitate removal of at least a portion of the dragout present on the substrate 22 prior to it entering the rinse chamber 16. For example, proximate an entry point for the substrate 22 into to the rinse chamber 16, one or more such devices (e.g., air knife, squeegee, nip point, etc.) may be arranged to act on the substrate 22 and return a portion of the dragout to the reaction bath 26 prior to the substrate entering the rinse chamber 16.

In various embodiments, the rinse chamber 16 may include a plurality of rollers 44 configured and arranged to direct the substrate 22 through one or more rinse stations. For example, as shown in FIG. 1, the rinse chamber 16 may include a first rinse station 46, a second rinse station 48, and a third rinse station 52. Alternatively, the rinse chamber may include any number of rinse stations such as one, two, or four or more rinse stations.

In some embodiments, the first rinse station 46 may include one or more fluid delivery devices 54 (e.g., spray heads, hoses, fluid knives, etc.) configured to discharge clean water onto the substrate 22 as it is transported through the first rinse chamber 46, a rinse collector 56 configured to collect the rinse (i.e., the diluted dragout), and a rinse collector outlet 57. The clean water delivery devices 54 may be in fluid communication with a clean water conduit 58, which may be in fluid communication with a clean water source 62 (e.g., deionized water). The clean water conduit 58 may include and/or be operatively associated with suitable fluid flow control components (e.g., valves, pumps) such that a clean water flow may be discharged onto the substrate 22 at a selected rate. The rinse collector outlet 57 may be fluidically coupled to the etchant bath 26, via a recycle flow path 64, which may include and/or be operatively associated with suitable fluid flow control components (e.g., valves, pumps, meters). In this manner, at least a portion of the dragout that remains on the substrate 22 following transport into the rinse chamber 16 may be collected and recycled back into the etchant bath 26 at a selected rate. While the present disclosure is described with respect to embodiments in which only the dragout rinse from the first rinse station is recycled back into the etchant bath 26, it is to be appreciated that the dragout rinse from any number of additional rinse stations may be collected and recycled back into the reaction bath 26.

In illustrative embodiments, the second and third rinse chambers 48, 52 may be configured substantially similarly to the first rinse chamber 48 (i.e., include one or more fluid delivery devices configured to discharge fluid onto the substrate 22 as it is transported through the rinse chamber). In some embodiments, rinse generated in either or both of the second and third rinse chambers 48, 52 may be collected in a rinse bath 66. Alternatively, the rinse generated in either or both of the second and third rinse chambers 48, 52 may be gathered in a collector. In various embodiments, the fluid delivery devices of the second and third rinse chambers 48, 52 may be in fluid communication with the rinse bath 66 or a clean water source, and be operatively associated with suitable fluid flow control components (e.g., valves, pumps, meters) such that that a fluid flow (of the rinse bath 66 or clean water) may be discharged onto the substrate 22 at a selected rate.

In various embodiments, the dryer zone 17 may include a plurality of rollers 68 configured and arranged to direct the substrate 22 through the dryer zone 17 such that any fluids remaining on the substrate 22 are removed. The dryer zone 17 may be configured as or include one or more drying apparatuses (e.g., blowers, fans, heating elements, air impingement nozzles, etc.) suitable for removing fluid from a substrate being transported via rollers.

In some embodiments, the system 10 may also include one or more controllers (not shown) operatively coupled to one or more components of the system 10 such that one or more system variables (e.g., web speed, flow rates, volumes, concentration set points, etc.) may be monitored and/or controlled by the controllers. Generally, the controllers may be configured as one or more processing devices (e.g., general purpose computers, programmable logic controllers, combinations thereof) having instructions stored thereon for monitoring system variables and causing components of the system 10 to perform specified functions. For example, the controllers may be provided with instructions to, in response to signals received from an operator and/or one or more components of the system 10 (e.g., sensors), selectively actuate one or more components of the system 10 (e.g., pumps, valves, meters) to achieve/maintain desired process conditions within the system 10. In illustrative embodiments, the controller may be configured to monitor and/or control any or all of: the rate of the substrate into the reactor vessel 14 (i.e., web speed), the rate of reaction bath removal, the rate of replenishment feed(s), the rate of clean water rinse in the first rinse station, and the rate of dragout recycle feed.

Generally, the substrate 22 may be formed as a continuous web that includes a reactable surface composition that is capable of reacting and/or solubilizing upon contact with one or more reaction agents of the reaction bath 26. In some embodiments, the substrate 22 may be formed as a continuous web that includes a film and a reactable surface composition that includes a metallic coating disposed on a major surface of the film. A major surface of the substrate 22 having a metallic coating disposed thereon may be referred to in the present disclosure as a metalized surface of the substrate 22. In various embodiments, the metalized surface of the substrate 22 may further include a patterned etch resist layer disposed on at least a portion thereof. As used herein, an etch resist patterned region is a portion of a metalized surface having an etch resist layer thereon, and an unpatterned region is a portion of a metalized surface having no etch resist layer thereon. Generally, during an etching process, the metal of the patterned etch resist regions may be retained on the substrate 22 and the metal of the unpatterned regions may be removed by an etch reaction, thereby forming a metal pattern.

In illustrative embodiments, suitable films for the substrate 22 may include flexible materials capable of roll-to-roll processing such as, paper, polymers, metals, and combinations thereof. Suitable polymers include thermoplastic and thermoset polymers Examples of thermoplastics include polyolefins, polyacrylates, polyamides, polyimides, polycarbonates, and polyesters. Further examples of thermoplastics include polyethylene, polypropylene, poly(methylmethacrylate), polycarbonate of bisphenol A, poly(vinyl chloride), polyethylene terephthalate, and poly(vinylidene fluoride). The films may have a thickness between about 2 µm to 500 µm, between about 25 µm to 250 µm, or between about 50 µm to 200 µm. The films may have a width of at least 1 inch, 12 inches, 24 inches, 36 inches, or 48 inches.

In some embodiments, the metallic coating may be segmentally or continuously coated onto a major surface of the film. The metallic coating may be deposited using any suitable method, for example, sputtering, evaporation, chemical vapor deposition, or chemical solution deposition (including electroless plating). The metallic coating may include any metal, metal alloy, intermetallic compound, metal oxide, metal sulfide, metal carbide, metal nitride, or combinations thereof. The metallic coating can be formed of a single layer or a plurality of layers. Suitable metals may include gold, silver, palladium, platinum, rhodium, copper, nickel, iron, indium, aluminum, tin, titanium, zinc, tantalum, as well as mixtures, alloys, and compounds of these elements. The metallic coatings may have a thickness between about 15 nm to 250 nm, between about 25 nm to 175 nm, or between about 50 nm to 150 nm. In some embodiments, the thickness of the (e.g. conductive) metal pattern is more than 250 nm.

In various embodiments, the substrate 22 may include an etch resist patterned region. The etch layer of the etch resist patterned region may be coated/deposited using any suitable method, for example, microcontact printing, dip-pen nanolithography, photolithography, ink-jet printing, spray coating, roll coating, and the like. In some embodiments, the etch layer of the etch resist patterned region may be a self-assembled monolayer. As used herein, "self-assembled monolayer" generally refers to a layer of molecules that are attached (e.g., by a chemical bond) to a surface and that have adopted a preferred orientation with respect to that surface and with respect to each other. Self-assembled monolayers have been shown to cover surfaces so completely that the properties of that surface are changed. For example, application of a self-assembled monolayer can result in a surface energy reduction and allow selective etching of metal that is not coated with the self-assembled monolayer. Various molecules that form a self-assembled monolayer are known such as organosulfur compounds, organosilanes and organophosphonic acids. Organosulfur compounds include for example alkylthiols, dialkyl disulfides, dialkyl sulfides, alkyl xanthates, dithiophosphates, and dialkylthiocarbamates. In various embodiments, the substrate 22 may be a self-assembled monolayer patterned substrate as described in U.S. Patent Application Publication No. 2012/0082825 (Zu et al.), which is incorporated by reference herein in its entirety.

In some embodiments, as will be discussed in further detail below, to facilitate control of characteristics of the reaction bath 26 during processing (e.g., a continuous wet etching process), it may be desirable to determine an amount of metal that is present in the unpatterned region per unit length of a given patterned substrate 22 (i.e., the amount of metal that will be removed per unit length by the etching process and subsequently deposited into the etchant bath 26). Various methods for making such determination may be employed. For example, an optical method may be employed in which an optical device scans a segment of the substrate 22 to determine a percent areal coverage of the unpatterned region of the substrate 22. From this percent areal coverage, and a known width and thickness of the metallic coating, the amount of metal that is present in the unpatterned region may be readily approximated. Alternatively, a sample of a given patterned substrate 22, having a known mass, may be subjected to etching, and subsequently weighed. The amount of metal that is present in the unpatterned region may then be approximated as the difference in mass between the unetched and etched substrate. Any other known methods for determining the amount of metal present in an unpatterned region of a patterned metalized substrate may be employed.

In various embodiments, processing (e.g., wet etching) of the substrate 22 may be carried out by contacting the substrate 22 with fluid from the reaction bath 26. Generally, the reaction bath may include one or more reaction agents that are capable of reacting with and/or solubilizing the reactable surface composition of the substrate 22. In embodiments in which the substrate 22 is a metalized substrate having an etch resist patterned region and an unpatterned region, the reaction bath 26 may be an etchant bath that includes one or more etching agents. In such embodiments, etching of the metalized substrate 22 may be selective, i.e. without significant etching of the surface regions comprising an etch resist layer. Useful chemical etching baths may be prepared by dissolving etchant species in water or a non-aqueous solvent (for example, with agitation or stirring, control of pH, control of temperature, and/or replenishment of etchant species upon their consumption, according to the nature of the etchant). Without intending to be bound by theory or mechanisms, the following discussion relates to selection of etchant species.

In some embodiments, the reaction bath 26 may include one or more oxidizing agents. The oxidizing agent may be a relatively small molecule oxidizing agent, for example, have a molecular weight of less than about 200 g/mole. Suitable small molecule oxidizing agents include for example cyanide ions in the presence of dissolved oxygen, ferricyanide ions, and ferric ions.

In various embodiments, the reaction bath 26 may also include one or more metal complexing agents such as thiourea $(NH_2)_2CS$ or a thiourea derivative (i.e. a class of compounds with the general structure $(R^1R^2N)(R^3R^4N)C=S$ wherein $R^1$, $R^2$, $R^3$, $R^4$ each are independently hydrogen atoms or some organic moiety such as ethyl or methyl). Thiourea and thiourea derivatives are related to thioamides e.g. $RC(S)NR_2$, where R is methyl, ethyl, etc. In some embodiments, a small molecule metal complexing agent, for example, having a molecular weight less than about 200 g/mole may be employed.

In illustrative embodiments, the oxidizing agent of the reaction bath 26 may include a ferric ion (e.g., in the form of ferric nitrate), and the metal complexing agent may include thiourea. In such embodiments, and where the metallic coating of the substrate 22 includes silver, a primary reaction (1) and first and second side reactions (2), (3) may be observed in the reactor vessel 14:

$$Ag+2CS(NH_2)_2+Fe^{3+} \rightarrow Ag(CS(NH_2)_2)_2^+ + Fe^{2+} \quad (1)$$

$$2CS(NH_2)_2+2Fe^{3+} \rightarrow (CS(NH_2)(NH))_2+2H^+ + 2Fe^{2+} \quad (2)$$

$$(CS(NH_2)(NH))_2 \rightarrow CS(NH_2)_2+NH_2CN+S \quad (3)$$

In other embodiments, the reaction bath 26 may include a bleach fix solution. Bleach-fix solutions to which the methods of the present disclosure are applicable may be solutions including ferric salts of aminopolycarboxylic acids as an oxidizing agent, and a water soluble thiosulfate as a metal complexing agent. Illustrative examples of the aminopolycarboxylic acids include nitrilotriacetic acid, ethylenediamine tetraacetic acid (EDTA), diethylenetriamine pentaacetic acid, ortho-diamine cyclohexane tetraacetic acid, ethylene glycol bis(aminoethyl ether)tetraacetic acid, diaminopropanol tetraacetic acid, and N-(2-hydroxyethyl)ethylenediamine triacetic acid. Thiosulfates that may be employed include ammonium thiosulfate and alkali metal thiosulfates, such as sodium thiosulfate and potassium thiosulfate.

In various embodiments, the oxidizing agent of the reaction bath 26 may include ferric ethylenediamine tetraacetic acid, and the metal complexing agent may include ammonium thiosulfate. In such embodiments, and where the metallic coating of the substrate 22 includes silver, a primary reaction (4) be observed in the reactor vessel 14:

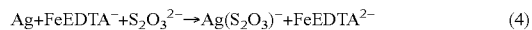
$$Ag+FeEDTA^- + S_2O_3^{2-} \rightarrow Ag(S_2O_3)^- + FeEDTA^{2-} \quad (4)$$

The present disclosure further relates to methods for continuously wet etching a substrate web. The methods for continuously wet etching may be carried out utilizing the system of FIG. 1.

Referring again to FIG. 1, the method may include transporting the substrate 22 at a selected rate from the entry zone 12 into the reactor vessel 14. As the substrate 22 travels through the reactor vessel 14, a major surface of the substrate 22 (e.g., a metalized patterned surface of the substrate 22) may be contacted with fluid from the reaction bath 26 to carry out selective etching of the substrate 22. As a result of the etching reaction and, depending on the etching chemistry, one or more side reactions occurring among components of the reaction bath, the etchant agents of the reaction bath (e.g., oxidizing and metal complexing agents) may be consumed, and etched metal from the substrate 22 may be deposited into the reaction bath 26. To account for consumption of etchant agents and accumulation of metal in the etchant bath 26, in some embodiments, the methods of the present disclosure may include continuous, periodic, or random delivery of replenishment feeds of any or all of the etchant agents (e.g., via the input flow paths 34, 36), and/or discharge of the reaction bath 26 from the reactor vessel 14 (e.g., via the output flow path 32).

Following transport through the reactor vessel 14, the method may include transporting the substrate 22 through the rinse chamber 16. At the first rinse station 46, the substrate 22 may be rinsed with a flow of clean water discharged at a selected rate from the water delivery devices 54. Following the first rinse station 46, the substrate 22 may be subjected to further rinse operations in the second and third rinse stations 48, 52 before being transported into the dryer zone 17. In the dryer zone 17, any fluid remaining on the substrate 22 may be evaporated or otherwise removed from the substrate 22. Following the dryer zone 17, the substrate 22 may be transported to one or more additional processing operations and/or stored for end-use.

In some embodiments, the methods of the present disclosure may further include collecting the rinse from the first rinse station 46 (e.g., in the rinse collector 56). The collected rinse may then, on a continuous, periodic, or random basis, be delivered at a selected rate to the reaction bath 26 as a recycle feed (e.g., via the recycle flow path 64).

In illustrative embodiments, the methods of the present disclosure may further include controlling and/or maintaining one or more characteristics of the reaction bath during continuous etching of a substrate 22. Such control of the reaction bath 26 may be carried out by the one or more controllers discussed above. For example, the methods of the present disclosure may include controlling and/or maintaining any or all of: (i) metal concentration in the reaction bath 26; (ii) reaction agent concentration in the reaction bath 26; and (iii) volume of the reaction bath, at least in part by controlling any or all of the (a) reaction bath removal rate; (b) reaction agent replenishment rate; and (c) reaction agent recycle rate. Specifically, in some embodiments, the methods of the present disclosure may include controlling any or all of (a), (b), and (c) such that any or all of (i), (ii), and (iii) are maintained at a predetermined set point, or are held above/below predetermined threshold values. In this manner, the methods of the present disclosure may facilitate continuous processing of substrates 22 having reactable surface compositions (e.g., wet etching of metalized substrates) for extended periods without the need for replacement of the reaction bath 26, and without slowing the reaction rate or causing defects in the reacted substrate product.

In various embodiments, the aforementioned control of system flow rates may include determining the flow rates based on one or more system variables and reaction kinetics. For example, in some embodiments, the flow rates may be determined based at least in part on a rate metal etched from the substrate enters the reaction bath (and thus, the rate that the substrate 22 is being transported through the reactor vessel 14). As discussed above, the amount of metal removed from a unit length of the substrate 22 may be approximated as the amount of metal present in the unpatterned region of the unetched substrate. From this approximation, and a known substrate web speed, the rate metal etched from the substrate enters the etchant bath may be readily determined. From this determined rate, and reaction kinetics with respect to the etching reaction and any side reactions occurring among the components of the reaction bath 26, the rates of accumulation of metal as well as the rates of etchant species consumption may be determined. These rates may, in turn, may be utilized to determine the system flow rates necessary to achieve desired characteristics of the reaction bath (e.g., component concentrations).

In some embodiments, the methods of the present disclosure may include maintaining concentrations of an oxidizing agent, a metal complexing agent, and a metal present in the reaction bath 26 at predetermined set points (or within some tolerance of a predetermined set point), while maintaining a constant volume of the reaction bath 26. In such an embodiment, the method may further include determining the etchant bath discharge rate, oxidizing agent replenishment rate, metal complexing agent replenishment rate, and the recycle rate to maintain concentration as follows:

$$\frac{dV_1}{dt} = \frac{dx}{dt}\Gamma P(c_{Me}^S)^{-1}$$

$$\frac{dV_R}{dt} = \frac{dV_1}{dt} + \frac{dV_{drag}}{dt} + \frac{dV_{vapor}}{dt} - \frac{dV_{MC}}{dt} - \frac{dV_{OX}}{dt}$$

-continued $$\frac{dV_{MC}}{dt} = \left[\frac{dD_{MC}}{dt} + R_{MC}\frac{dc_{Me}}{dt}V_s + \frac{dV_1}{dt}c_{MC}^s - \frac{dV_R}{dt}c_{MC,R} + \frac{dV_{vapor}}{dt}c_{MC}^S\right]c_{MC,m}^{-1}$$

$$\frac{dV_{OX}}{dt} = \left[\frac{dD_{OX}}{dt} + R_{OX}\frac{dc_{Me}}{dt}V_s + \frac{dV_1}{dt}c_{OX}^s - \frac{dV_R}{dt}c_{OX,R} + \frac{dV_{vapor}}{dt}c_{OX}^S\right]c_{OX,m}^{-1};$$

where $$\frac{dV_1}{dt}$$

is the etchant bath discharge rate;

$$\frac{dx}{dt}$$

is the metalized substrate feed rate;

$\Gamma$ is a numerical constant defined as $\Gamma = w_s t_{Me} \rho_{Me} M_{Me}^{-1}$, where $w_s$ is the width of substrate, $t_{Me}$ is the thickness of metal on the substrate, $\rho_{Me}$ is the density of the metal, and $M_{Me}$ is the molecular mass of the metal;

P is a scaling factor for the % of metal etched;

$c_{Me}^S$ is the steady state concentration of metal in the etchant bath;

$$\frac{dV_R}{dt}$$

is the flow rate of the drag out and rinse collected in the first rinse station and recycled back to the etchant bath;

$$\frac{dV_{drag}}{dt}$$

is the rate of etchant bath loss due to dragout, defined as $$\frac{dV_{drag}}{dt} = \frac{dV_R}{dt} - \frac{dV_{Dl1}}{dt}, \text{ where } \frac{dV_{Dl1}}{dt}$$

is the rate clean water rinse is discharged onto the substrate in the first rinse station, defined as $$\frac{dV_{Dl1}}{dt} = \frac{dV_R}{dt} + \frac{dV_{drag2}}{dt} - \frac{dV_{drag}}{dt} \text{ where } \frac{dV_{drag2}}{dt}$$

is the dragout from the first rinse to the second rinse; dragout $$\left(\frac{dV_{drag}}{dt}\right)$$

is calculated during steady state operation upon the first rinse being recycled back to the etch sump:

$$\frac{dV_{dpl}}{dt} = \frac{dV_{DI1}}{dt} + \frac{dV_{drag}}{dt} - \frac{dV_R}{dt}$$

where $dV_{dpl/dt}$ is the change of the fluid level in a standpipe between the first rinse and the etchant bath, as measured by a level sensing device such as a Flowline Echopod ultrasonic level sensor; $dV_{dpl/dt}$ is held at zero by adjusting $$\frac{dV_{DI1}}{dt},$$

and dragout can then be determined as $$\frac{dV_{drag}}{dt} = \frac{dV_R}{dt} - \frac{dV_{DI1}}{dt};$$

$$\frac{dV_{vapor}}{dt}$$

is the rate of etchant bath loss to vaporization;

$$\frac{dV_{MC}}{dt}$$

is the rate of replenishment of the metal complexing agent $$\frac{dD_{MC}}{dt}$$

is the rate of loss of the metal complexing agent due to one or more side reactions;

$R_{MC}$ is a stoichiometry constant for the metal complexing agent in the primary etching reaction;

$$\frac{dc_{Me}}{dt}$$

is the rate of change of the concentration of the metal;

$V_s$ is the volume of the etchant bath;

$c_{MC}^S$ is the steady state concentration of the metal complexing agent in the etchant bath;

$c_{MC,R}$ is the concentration of the metal complexing agent in the drag out rinse;

$c_{MC,m}$ is the concentration of the metal complexing agent in the replenishment feed;

$$\frac{dV_{OX}}{dt}$$

is the rate of replenishment of the oxidizing agent;

$$\frac{dD_{OX}}{dt}$$

is the rate of loss of the oxidizing agent due to one or more side reactions;

$R_{OX}$ is a stoichiometry constant for the oxidizing agent in the primary etching reaction;

$c_{OX}^S$ is the steady state concentration of the oxidizing agent in the etchant bath; $c_{OX,R}$ is the concentration of the oxidizing agent in the drag out rinse bath;

$c_{OX,m}$ is the concentration of the oxidizing agent in the replenishment feed.

EXAMPLES

The operation of the present disclosure will be further described with regard to the following detailed examples. These examples are offered to further illustrate the various specific and preferred embodiments and techniques. It should be understood, however, that many variations and modifications may be made while remaining within the scope of the present disclosure.

Example 1

A roll to roll etch system, as generally described above, utilizing spray delivery of an etch solution with an eight foot residence distance within an etching zone was used to remove silver from a patterned, 10" wide PET substrate, such as Dupont ST504. Prior to etching, the substrate was sputter-coated with silver at a thickness of approximately 100 nm using a vacuum coating apparatus, such as one available from General Vacuum Equipment, Ltd, and subsequently patterned with alkanethiol, as generally described above. In order to determine pump rates in accord with the methods of the present disclosure, the percent areal coverage of alkanethiol on the silver was determined. This was accomplished by scanning an image of an etched sample and utilizing ImageJ software (Rasband, W. S., ImageJ, U.S. National Institutes of Health, Bethesda, Md., USA, http://imagej.nih.gov/ij/, 1997-2011.) to determine what percent of the final, etched area was silver (black pixels in scanned image) and what percent was bare PET (white pixels in scanned image). Micron-scale features of the pattern, which were not detectable in the scanned copy of the sample, were accounted for via their known areal coverage from the pattern design. The pattern of this example was determined to be 73.5% etched (i.e. 26.5% silver remaining).

The etching solution of this example was an aqueous solution of 20 mM ferric nitrate (GFS Chemicals, Inc., Powell, Ohio) and 30 mM thiourea (GFS Chemicals, Inc., Powell, Ohio). 132 L of the etching solution were prepared within the etch vessel, and the patterned silver was etched at a web rate of 4 feet/minute. From prior experimental data, it was known that undesirable precipitation would occur within the solution at about 400 ppm silver. Therefore, a steady state control method was enforced beginning at 400 ppm silver (220 minutes into the run), as calculated using replenishment and recycle rates, silver coating dimensions, and the percent of silver etched from the substrate. Table 1 includes concentrations, pump rates, and other values input or calculated using the equations provided above. Using these conditions, patterned web was etched for 8 hours with no observed precipitation onto the substrate.

TABLE 1

Pump rates and solution concentrations of Example 1.

| | Quantity | Unit |
|---|---|---|
| Ferric Nitrate Concentration | 20 | mM |
| Thiourea Concentration | 30 | mM |
| Ferric Nitrate Replenishment Feed Concentration | 0.53 | M |
| Thiourea Replenishment Feed Concentration | 0.35 | M |
| Ferric Nitrate Pre-Steady State Replenishment Rate | 27.4 | mL/min |
| Thiourea Pre-Steady State Replenishment Rate | 26.7 | mL/min |
| Ferric Nitrate Steady State Replenishment Rate | 61.6 | mL/min |
| Thiourea Steady State Replenishment Rate | 60.9 | mL/min |
| Measured Rate of Solution Loss to Rinse Sump | 60 | mL/min |
| Rate of Recycled Rinse Pumped Back to Etch Sump in Steady State | 536 | mL/min |
| Rate of Etch Sump Solution Removal during Steady State | 598 | mL/min |

Example 2

A patterned silver substrate substantially similar to that of Example 1 was etched, as described in Example 1, with a web rate of 6.7 feet/minute using a 40 mM ferric nitrate, 60 mM thiourea aqueous solution. Steady state was enforced beginning at 453 ppm silver (150 minutes into the run) and the run proceeded for a total of 3 hours with no precipitation observed. Pump rates and other values are shown in Table 2.

TABLE 2

Pump rates and solution concentrations used in Example 2.

| | Quantity | Unit |
|---|---|---|
| Ferric Nitrate Concentration | 40 | mM |
| Thiourea Concentration | 60 | mM |
| Ferric Nitrate Replenishment Feed Concentration | 1.05 | M |
| Thiourea Replenishment Feed Concentration | 0.7 | M |
| Ferric Nitrate Pre-Steady State Replenishment Rate | 47.4 | mL/min |
| Thiourea Pre-Steady State Replenishment Rate | 38.7 | mL/min |
| Ferric Nitrate Steady State Replenishment Rate | 97.8 | mL/min |
| Thiourea Steady State Replenishment Rate | 89.1 | mL/min |
| Measured Rate of Solution Loss to Rinse Sump | 80 | mL/min |
| Rate of Recycled Rinse Pumped Back to Etch Sump in Steady State | 776 | mL/min |
| Rate of Etch Sump Solution Removal during Steady State | 883 | mL/min |

Example 3

A patterned silver substrate substantially similar to that of Example 1 was etched, as described in Example 1, with a web rate of 3.0 feet/minute using a 1:1 blend of Part A and Part B of RA-2SM bleach fix (Kodak, Rochester, N.Y.) diluted 9:1 DI water: bleach fix. The bleach fix portion of the solution was a 1:1 blend of Part A, an aqueous solution of primarily ammonium thiosulfate, and Part B, an aqueous solution of primarily ferric ammonium ethylene diaminetetraacetic acid (ferric ammonium EDTA). The system was run in pre-steady state for the duration of the run. It is believed that the process would benefit from an enforcement of steady state beginning at or before 345 ppm silver due to a slight haze that appeared at this point. Pump rates and concentrations calculated for a steady state run with a setpoint of 345 ppm silver are shown Table 3.

TABLE 3

Pump rates and solution concentrations used in Example 3.

| | Quantity | Unit |
|---|---|---|
| Ferric Ammonium EDTA Concentration | 21 | mM |
| Ammonium Thiosulfate Concentration | 37 | mM |
| Ferric Ammonium EDTA Replenishment Feed Concentration | 105 | M |
| Ammonium Thiosulfate Replenishment Feed Concentration | 185 | M |
| Ferric Ammonium EDTA Pre-Steady State Replenishment Rate | 11 | mL/min |
| Ammonium Thiosulfate Pre-Steady State Replenishment Rate | 11 | mL/min |
| Ferric Ammonium EDTA Steady State Replenishment Rate | 37 | mL/min |
| Ammonium Thiosulfate Steady State Replenishment Rate | 37 | mL/min |
| Estimated Rate of Solution Loss to Rinse Sump | 45 | mL/min |
| Rate of Recycled Rinse Pumped Back to Etch Sump in Steady State | 490 | mL/min |
| Rate of Etch Sump Solution Removal during Steady State | 519 | mL/min |

What is claimed is:

1. A method of patterning a substrate comprising:
providing a substrate comprising a continuous web having a metalized surface having an etch resist patterned region and an unpatterned region;
passing the substrate web through a reaction vessel, wherein the reaction vessel comprisesan etchant bath comprising an oxidizing agent and a metal complexing agent;
wet etching the substrate web within the reaction vessel by contacting the metalized surface with the oxidizing and metal complexing agents to remove metal from the unpatterned region;
after wet etching the substrate: (i) rinsing the wet etched substrate with a first rinse of water; (ii) collecting the rinse; (iii) recycling at least a portion of the collected rinse to the etchant bath;
maintaining the concentrations of the oxidizing and metal complexing agents in the etchant bath by delivering a replenishment feed of each of the oxidizing and metal complexing agents to the etchant bath at a first replenishment feed rate and a second replenishment feed rate, respectively; and maintaining the concentration of the metal in the etchant bath by discharging an amount of the etchant bath from the reaction vessel at an etchant bath removal rate;

wherein the first and second replenishment feed rates and the etchant bath removal rate are determined based at least in part on a rate that metal etched from the substrate enters the etchant bath.

2. The method of claim 1, wherein either or both of the first and second replenishment feed rates are further determined based at least in part on a rate of consumption of the oxidizing and metal complexing agents in either or both of: (i) an etch reaction; and (ii) one or more side reactions occurring among components of the etchant bath.

3. The method of claim 1, wherein either or both of the first and second replenishment feed rates are further determined based at least in part on a rate at which the collected rinse is recycled to the reactor vessel.

4. The method of claim 1, wherein a volume of the etchant bath is maintained substantially constant.

5. The method of claim 1, wherein the oxidizing agent comprises ferric nitrate.

6. The method of claim 1, wherein the metal complexing agent comprises thiourea or a thiourea derivative.

7. The method of claim 1, wherein the etchant bath comprises a bleach-fix solution.

8. The method of claim 7, wherein the oxidizing agent comprises a ferric salt of an aminopolycarboxylic acid.

9. The method of claim 7, wherein the metal complexing agent comprises a thiosulfate.

10. The method of claim 1, wherein the metal comprises one or more metals selected from the group consisting of silver, gold, and combinations thereof.

11. The method of claim 1, wherein the patterned region comprises a self-assembled monolayer patterned region.

12. The method of claim 11, wherein the self-assembled monolayer patterned region is microcontact printed onto the metalized surface.

13. The method of claim 12, wherein the monolayer comprises an organosulfur compound.

14. The method of claim 1 in which the oxidizing and metal complexing agent replenishment feed rates, the etchant bath removal rate and the recycle rate are controlled to maintain concentration of metal from the metalized surface in the etchant bath below the concentration at which metal precipitates onto the substrate web.

15. The method of claim 1 which operates at steady state conditions.

16. The method of claim 15 in which in which the etchant bath is maintained at constant volume, and etchant bath removal rate, recycle rate, metal complexing agent replenishment rate and oxidizing agent replenishment rate, are controlled using the following equations:

$$\frac{dV_1}{dt} = \frac{dx}{dt}\Gamma P(c_{Me}^s)^{-1}$$

$$\frac{dV_R}{dt} = \frac{dV_1}{dt} + \frac{dV_{drag}}{dt} + \frac{dV_{vapor}}{dt} - \frac{dV_{MC}}{dt} - \frac{dV_{OX}}{dt}$$

$$\frac{dV_{MC}}{dt} = \left[\frac{dD_{MC}}{dt} + R_{MC}\frac{dc_{Me}}{dt}V_s + \frac{dV_1}{dt}c_{MC}^s - \frac{dV_R}{dt}c_{MC,R} + \frac{dV_{vapor}}{dt}c_{MC}^s\right]c_{MC,m}^{-1}$$

$$\frac{dV_{OX}}{dt} = \left[\frac{dD_{OX}}{dt} + R_{OX}\frac{dc_{Me}}{dt}V_s + \frac{dV_1}{dt}c_{OX}^s - \right.$$

-continued $$\left.\frac{dV_R}{dt}c_{OX,R} + \frac{dV_{vapor}}{dt}c_{OX}^s\right]c_{OX,m}^{-1}$$

in which $$\frac{dV_1}{dt}$$

is the etchant bath removal rate;

$$\frac{dx}{dt}$$

is the metalized substrate web feed rate;

$\Gamma$ is a numerical constant defined as $\Gamma = w_s t_{Me} \rho_{Me} M_{Me}^{-1}$, wherein $w_s$ is the width of substrate, $t_{Me}$ is the thickness of metal on the substrate, $\rho_{Me}$ is the density of the metal, and $M_{Me}$ is the molecular mass of the metal;

P is a scaling factor for the percent of metal etched;

$c_{Me}^S$ is the steady state concentration of metal in the etchant bath;

$$\frac{dV_R}{dt}$$

is the flow rate of rinse recycled to the etchant bath;

$$\frac{dV_{drag}}{dt}$$

is the rate of etchant bath loss due to dragout, defined as $$\frac{dV_{drag}}{dt} = \frac{dV_R}{dt} - \frac{dV_{DI1}}{dt},$$

wherein $$\frac{dV_{DI1}}{dt}$$

is the rate water rinse is discharged onto the substrate in the first rinse;

$$\frac{dV_{vapor}}{dt}$$

is the rate of etchant bath loss to vaporization;

$$\frac{dV_{MC}}{dt}$$

is the rate of replenishment of the metal complexing agent $$\frac{dD_{MC}}{dt}$$

is the rate of loss of the metal complexing agent due to one or more side reactions;

$R_{MC}$ is a stoichiometry constant for the metal complexing agent in the primary etching reaction;

$$\frac{dc_{Me}}{dt}$$

is the rate of change of the concentration of the metal;

$V_s$ is the volume of the etchant bath;

$c_{MC}{}^S$ is the steady state concentration of the metal complexing agent in the etchant bath;

$C_{MC,R}$ is the concentration of the metal complexing agent in the drag out rinse;

$C_{MC,m}$ is the concentration of the metal complexing agent in the replenishment feed;

$$\frac{dV_{OX}}{dt}$$

is the rate of replenishment of the oxidizing agent;

$$\frac{dD_{OX}}{dt}$$

is the rate of loss of the oxidizing agent due to one or more side reactions;

$R_{OX}$ is a stoichiometry constant for the oxidizing agent in the primary etching reaction;

$c_{OX}{}^S$ is the steady state concentration of the oxidizing agent in the etchant bath;

$c_{OX,R}$ is the concentration of the oxidizing agent in the first rinse; and $c_{OX,m}$ is the concentration of the oxidizing agent in the replenishment feed.

17. A method of processing a substrate comprising:
providing a continuous web substrate comprising a surface composition capable of reacting and/or solubilizing in a reaction bath containing one or more reaction agents;
passing the substrate through a reaction vessel, wherein the reaction vessel comprises a reaction bath comprising a first reaction agent and a second reaction agent;
contacting the surface composition with the first and second reaction agents to carry out a reaction therebetween;
following contacting of the surface composition with the first and second reaction agents: (i) rinsing the substrate web; (ii) collecting the rinse; and (iii) recycling at least a portion of the collected rinse to the reaction bath; and
maintaining the concentrations of the first and second reaction agents in the reaction bath by delivering a replenishment feed of each of the first and second reaction agents to the reaction bath,
wherein the first and second reaction agents are delivered to the reaction bath at a first replenishment feed rate and a second replenishment feed rate, respectively; and
wherein the first and second replenishment feed rates are determined based at least in part on a rate that the substrate is transported through the reaction vessel.

18. The method of claim 17, wherein the web surface composition comprises metal, and wherein the method further comprises maintaining a concentration of the metal in the reaction bath by discharging an amount of the reaction bath from the reaction vessel at a reaction bath removal rate, and wherein the reaction bath removal rate is determined based at least in part on the rate that the substrate is transported through the reaction vessel.

19. The method of claim 18, wherein either or both of the first and second replenishment feed rates are further determined based at least in part on a rate at which the collected rinse is recycled to the reaction bath.

20. The method of claim 18, wherein the first reaction agent comprises an oxidizing agent, and the second reaction agent comprises a metal complexing agent.

* * * * *